US009695992B2

(12) United States Patent
Schadt et al.

(10) Patent No.: US 9,695,992 B2
(45) Date of Patent: Jul. 4, 2017

(54) LUMINAIRE WITH LEDS AND CYLINDRICAL LENS

(71) Applicant: Heraeus Noblelight GmbH, Hanau (DE)

(72) Inventors: Susanne Schadt, Langenselbold (DE); Michael Peil, Otzberg (DE); Harald Maiweg, Korschenbroich (DE)

(73) Assignee: Heraeus Noblelight GmbH, Hanau (DE)

( * ) Notice: Subject to any disclaimer, the term of this patent is extended or adjusted under 35 U.S.C. 154(b) by 155 days.

(21) Appl. No.: 14/397,650

(22) PCT Filed: Mar. 21, 2013

(86) PCT No.: PCT/EP2013/000861
§ 371 (c)(1),
(2) Date: Oct. 29, 2014

(87) PCT Pub. No.: WO2013/164053
PCT Pub. Date: Nov. 7, 2013

(65) Prior Publication Data
US 2015/0124458 A1    May 7, 2015

(30) Foreign Application Priority Data
May 2, 2012   (DE) .................. 10 2012 008 638

(51) Int. Cl.
*F21V 5/00* (2015.01)
*H01L 33/58* (2010.01)
(Continued)

(52) U.S. Cl.
CPC ............ *F21K 9/50* (2013.01); *B41F 23/0409* (2013.01); *F21K 9/60* (2016.08); *F21V 5/007* (2013.01);
(Continued)

(58) Field of Classification Search
CPC .. H01L 25/0753; H01L 33/58; B41F 23/0409; F21K 9/50; F21V 13/04;
(Continued)

(56) References Cited

U.S. PATENT DOCUMENTS 7,300,177 B2   11/2007  Conner
8,029,157 B2 *  10/2011  Li ........................ F21V 5/048
                                                        362/245

(Continued)

FOREIGN PATENT DOCUMENTS

CN          1914929 A       2/2007
CN        102317676 A       1/2012
(Continued)

OTHER PUBLICATIONS

Office Action and Search Report issued Dec. 27, 2014 in TW Application No. 102113843.
(Continued)

*Primary Examiner* — Peggy Neils
(74) *Attorney, Agent, or Firm* — Panitch Schwarze Belisario & Nadel LLP

(57) ABSTRACT

A lamp is provided having at least one module that includes a plurality of LEDs distributed over a module surface. The plurality of LEDs are arranged in a row of a plurality of rows in a longitudinal direction of the at least one module. Each of the plurality of rows are arranged next to each other in a transverse direction of the at least one module that is perpendicular to the longitudinal direction. The lamp includes an optical system for bundling the light emitted by the plurality of LEDs. The optical system includes at least one cylinder lens that extends in the longitudinal direction. The light of at least some of the plurality of LEDs from a first row of the plurality of rows is bundled into a line on a target surface by the at least one cylinder lens.

9 Claims, 3 Drawing Sheets

(51) Int. Cl.
| | |
|---|---|
| *F21K 99/00* | (2016.01) |
| *G02B 3/00* | (2006.01) |
| *G02B 3/06* | (2006.01) |
| *B41F 23/04* | (2006.01) |
| *F21V 5/04* | (2006.01) |
| *F21V 13/04* | (2006.01) |
| *F21K 9/60* | (2016.01) |
| *H01L 25/075* | (2006.01) |

(52) U.S. Cl.
CPC .............. *F21V 5/043* (2013.01); *F21V 13/04* (2013.01); *G02B 3/005* (2013.01); *G02B 3/06* (2013.01); *H01L 25/0753* (2013.01); *H01L 33/58* (2013.01); *H01L 2924/0002* (2013.01)

(58) Field of Classification Search
CPC .......... F21V 5/027; F21V 5/043; F21V 5/007; G02B 3/005; G02B 3/06
See application file for complete search history.

(56) References Cited

U.S. PATENT DOCUMENTS

| | | | |
|---|---|---|---|
| 8,419,219 B2* | 4/2013 | Yamamoto | H01L 33/54 362/231 |
| 8,786,656 B2* | 7/2014 | Kim | G02B 3/005 347/241 |
| 2005/0281029 A1 | 12/2005 | Inamoto | |
| 2007/0030676 A1 | 2/2007 | Ichihara | |
| 2011/0198619 A1 | 8/2011 | Chiang et al. | |
| 2012/0087013 A1* | 4/2012 | Liu | B29D 11/00278 359/628 |
| 2012/0164585 A1* | 6/2012 | Ikeda | G03F 7/70425 430/325 |

FOREIGN PATENT DOCUMENTS

| | | |
|---|---|---|
| DE | 102010013286 A1 | 9/2011 |
| EP | 0625846 A1 | 11/1994 |
| EP | 1403077 A1 | 3/2004 |
| JP | 2010-272858 A | 12/2010 |
| WO | 2005084038 A2 | 9/2005 |
| WO | 2012031703 A1 | 3/2012 |

OTHER PUBLICATIONS

Office Action issued Mar. 12, 2015 in DE Application No. 10 2012 008 638.5.

Int'l Search Report and Written Opinion issued Aug. 20, 2013 in Int'l Application No. PCT/EP2013/000861.

Office Action issued Jan. 22, 2013 in DE Application No. 10 2012 008 638.5.

Office Action issued Mar. 24, 2016 in KR Application No. 1020147030238.

* cited by examiner

LUMINAIRE WITH LEDS AND CYLINDRICAL LENS

CROSS-REFERENCE TO RELATED APPLICATIONS

This application is a Section 371 of International Application No. PCT/EP2013/000861, filed Mar. 21, 2013, which was published in the German language on Nov. 7, 2013, under International Publication No. WO 2013/164053 A1 and the disclosure of which is incorporated herein by reference.

BACKGROUND OF THE INVENTION

The invention relates to a lamp comprising at least one module having a plurality of light emitting diodes (LEDs) distributed over a module surface. The plurality of LEDs are arranged in a row in a longitudinal direction of the at least one module. A multiple of the rows are arranged next to each other in a transverse direction of the at least one module that is perpendicular to the longitudinal direction. The lamp comprises an optical system for bundling the light emitted by the LEDs.

International Publication No. WO 2012/031703 A1 describes a production method for chip-on-board modules, in which a substrate comprises a plate-shaped carrier having multiple LEDs. A surface of the substrate is provided, in an open casting mold, with a cover made up of a layer for providing an optical system.

BRIEF SUMMARY OF THE INVENTION

The object of the invention is to devise an LED lamp that can be used to attain homogeneous irradiation density in a defined structure.

The object is met through an LED lamp comprising at least one module having a plurality of LEDs distributed over a surface of the at least one module. The plurality of LEDs are arranged in a row in a longitudinal direction of the at least one module. A multiple of the rows are arranged next to each other in a transverse direction of the at least one module that is perpendicular to the longitudinal direction. The LED lamp comprises an optical system for bundling the light emitted by the LEDs. The optical system comprises at least one first cylinder lens that extends in the longitudinal direction. The light of at least some of the LEDs from a first row of the rows is bundled into a line on a target surface by the at least one first cylinder lens.

The use of a cylinder lens that extends over a plurality of LEDs allows for homogeneous bundling of the light of the individual LEDs in an effective manner and with few components.

In the scope of the invention, a module shall be understood to mean any spatially-fixed arrangement of a plurality of LEDs. In this context, the module surface shall be understood to mean a surface connecting all LEDs. In the scope of the invention, the module surface can just as well comprise a curvature, for example a barrel-like curvature in the transverse direction. However, it is preferred for the module surface to be planar.

The module is generally advantageously, but not necessarily, provided as an integrated chip-on-board (COB) module, in which the LEDs and further electronic components, if applicable, are arranged on a two-dimensional carrier.

In general, the lamp according to the invention can extend in any way or shape in particular in the longitudinal direction. An extension in the transverse direction depends mainly on the requirements with respect to the number, power, and intensity of the lines on the target surface. Regarding the extension in the longitudinal direction, multiple modules can be arranged one behind the other depending on the required length, which applies analogously to optical systems that may be used.

In a generally advantageous refinement of the invention, the optical system comprises at least one second cylinder lens that extends in the longitudinal direction, wherein the light of at least some of the LEDs from a second row of the plurality of rows is bundled into a line on a target surface by the at least one second cylinder lens. This allows multiple rows of LEDs of the module to be bundled into lines. A large opening angle of the lights can be captured and transported in the transverse direction as well.

In detail, preferably, but not necessarily, the at least one first cylinder lens and the at least one second cylinder lens bundle the light into the same line on the target surface. This provides for particularly intense brightness on the target surface. The homogeneity of the light intensity along the line can be further improved easily in this context, for example through arranging the LEDs of the two rows at an offset from each other in the longitudinal direction. Alternatively, or in addition, the homogeneity can be further optimized through measures related to the optical system affecting the bundling.

In a preferred exemplary embodiment of the invention, the optical system comprises a primary optical system for bundling the emitted light, wherein the primary optical system comprises a plurality of lenses that are arranged right on the LEDs. A primary optical system of this type can be used to transport a particularly large spatial angle of the light that is usually emitted by the LEDs at a large angle. This can concern, for example, multiple collecting lenses that are each arranged above an LED. As a matter of principle, the cylinder lens can also be a component of the primary optical system and can be arranged right above the LEDs.

Alternatively, or in addition to, a collecting lens or cylinder lens, the primary optical system can also comprise reflectors that are arranged immediately lateral to the LEDs and further improve a useful spatial angle range of the transported light. This can concern, for example, rotationally symmetrical reflectors that are allocated to individual LEDs.

In a preferred refinement, the primary optical system is provided as a transparent polymer layer that is applied to the modules and extends, as one part, over at least multiple LEDs. A polymer layer of this type can be provided, for example, according to the optical systems described in International Publication No. WO 2012/031703 A1. In this context, an LED module is covered with a UV-resistant silicone in an open casting mold.

In a preferred refinement of a primary optical system, the lenses that are arranged above the LEDs are positioned at a lateral offset in the transverse direction with respect to a center of the LEDs. This enables good bundling of a large opening angle in the transverse direction when the line of the target surface is not situated in the geometrical emission direction of the LEDs of the respective row. Accordingly, the offset in a preferred refinement can be increasingly larger, the farther the row of LEDs is situated from the line in the transverse direction. In particular, a central row of LEDs may be present whose geometrical emission direction intersects with the line, wherein the lens or lenses of the central row do not comprise an offset.

Advantageously, at least 50% of the light emitted by the LEDs is in a wavelength range below 470 nm. This allows the lamp to be designed as a UV emitter, at least mainly. Another combination of features according to the invention allows the UV emitter to be flexibly integrated into a technical device, for example a printing machine.

Alternatively, at least 50% of the light emitted by the LEDs is in a wavelength range above 780 nm. This allows the lamp to be designed as an IR emitter, at least mainly. Another combination of features according to the invention allows the IR emitter to be flexibly integrated into a technical device, for example a printing machine.

In a particularly preferred embodiment of the invention, the optical system comprises a secondary optical system that is arranged in an optical path of the light while being spatially separated from the module. For differentiation from the term of primary optical system, a secondary optical system is understood in the present case to generally mean an optical system that is not positioned right on the LEDs. Accordingly, embodiments comprising a secondary optical system, but no primary optical system, and vice versa are feasible. In a particularly preferred embodiment, both a primary optical system and a secondary optical system are arranged in the optical path of the lamp resulting in a particularly compact design providing high and homogeneous irradiation intensity.

According to a preferred design detail, the secondary optical system is provided as a transparent polymer layer on a transparent substrate. In this context, the secondary optical system can be manufactured like the optical systems described in International Publication No. WO 2012/031703 A1, wherein a transparent substrate, for example glass, in place of an LED module, is being covered with a UV-resistant silicone in an open casting mold.

According to a particularly preferred design detail, a cylinder lens is provided on the secondary optical system, which renders the homogeneous bundling of the light emitted by the LEDs into the line, particularly effective. In this context, it is particularly preferred for the secondary optical system to comprise multiple cylinder lenses arranged next to each other in a plane. Accordingly, each of the multiple cylinder lenses can bundle the light of one or more of the rows of LEDs that are situated next to each other such that altogether a large number of rows of LEDs can contribute to the total intensity of the lamp. In particular, the various cylinder lenses can bundle the light of the LEDs into the same line.

In a feasible embodiment of the invention, a plane of the cylinder lenses is inclined with respect to the module surface and/or target surface. This is a simple way of compensating for an offset between the line and a position of the module in the transverse direction. Accordingly, modules can be provided, for example, in the transverse direction on each side of the line with each of the modules being placed at a tilt with respect to a secondary optical system, thus allowing for particularly effective bundling into the line. Inclined arrangement of the secondary optical system or of the module and the secondary optical system with respect to the target surface is just as feasible.

A further embodiment of the invention provides a central plane of the row of LEDs and a central optical axis, which is situated parallel to the central axis of the row of LEDs, of a cylinder lens bundling the light of the row to be offset with respect to each other in the transverse direction. This also allows simple and effective bundling of a large opening angle into the line to be attained, in particular when the line is arranged at an offset with respect to the central plane of the LEDs in the transverse direction. For further optimization, the offset with respect to an allocated cylinder lens can differ for different rows of LEDs depending on the distance of the line from the row of LEDs in the transverse direction.

It is generally advantageous for the invention to provide a packing density of the LEDs in the longitudinal direction to be larger than in the transverse direction. The lower packing density in the transverse direction can be balanced through an optimized transport optical system according to the invention, such that the same intensity on the target surface overall can be attained with fewer LEDs. The module can, for example, be a COB module, in which the packing density is at a maximum in the longitudinal direction. This is usually limited by the technical configuration options of modules of this type. However, the packing density being at a maximum in the longitudinal direction is optimal for the homogeneity of the intensity distribution over the line. The packing density in the transverse direction can, for example, only be 80%, preferably no more than 60%, of a packing density in the longitudinal direction.

The object of the invention is also met through a device for drying a coating, comprising a lamp, according to the invention. The lamp according to the invention is particularly well-suited for this purpose, because it combines high irradiation intensities and flexible and, in particular, compact design.

In a preferred refinement, a two-dimensional substrate bearing the coating to be dried, and the lamp can be moved towards each other in a conveying direction, wherein the lamp extends at least partly over a width of the substrate in a transverse direction and is arranged at a defined distance above the substrate. This shall include scanning of the substrate surface in multiple runs. The substrate can, for example, be printed matter that is coated with lacquer or another substance being printed on it in a printing machine.

The object of the invention is also met through the use of a lamp, according to the invention, for drying a coating, preferably in a printing procedure.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Figure 1:
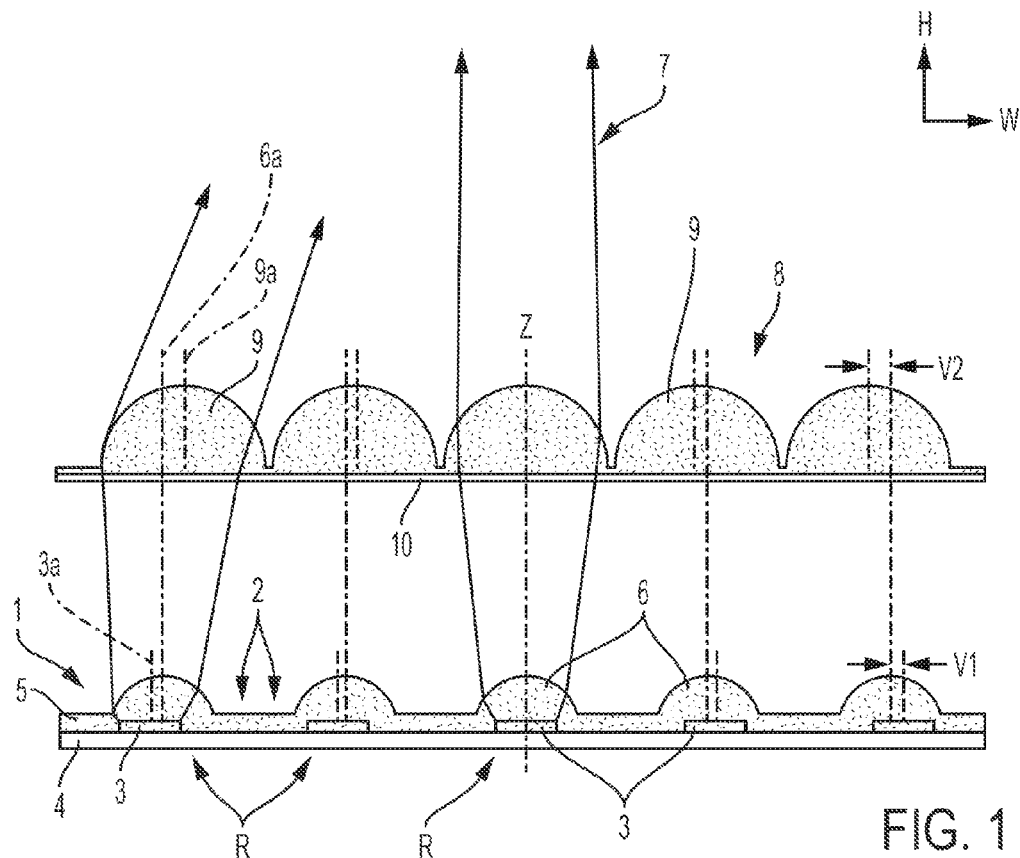
FIG. 1 is a schematic representation of a lamp according to a first embodiment of the invention.
Figure 2:
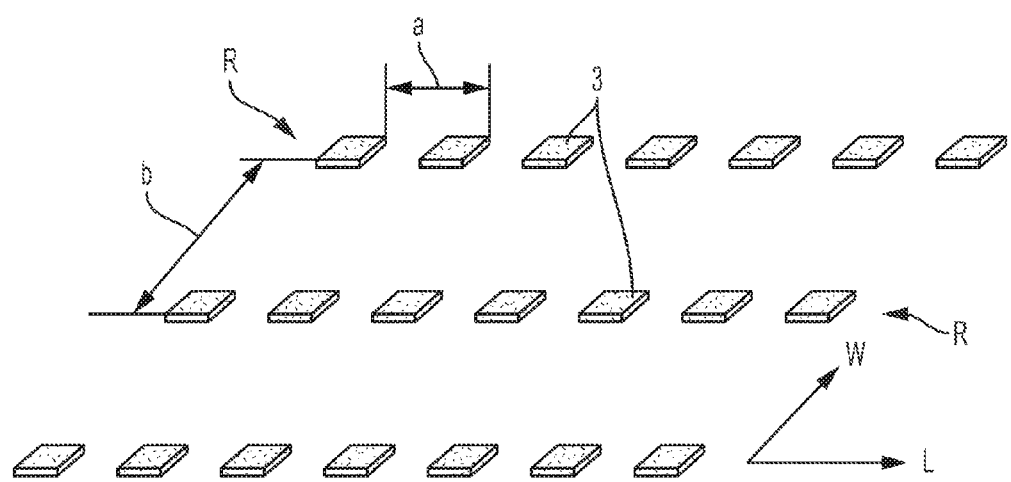
FIG. 2 is a schematic representation of LEDs of an LED module of the lamp of FIG. 1.
Figure 3:
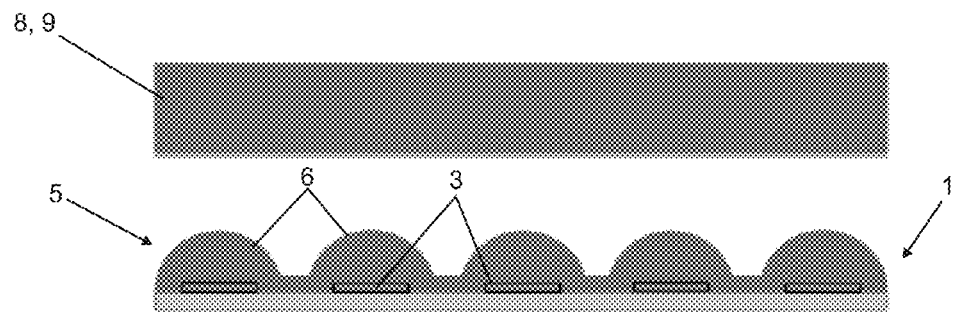
FIG. 3 is a schematic cross-sectional view in a longitudinal direction of the lamp of FIG. 1.

A lamp according to the invention according to FIG. 1 comprises an LED module 1 having multiple LEDs 3 distributed in an array across a module surface 2 that extends perpendicular to the plane of the drawing. The multiple LEDs 3 and further electronic components (not shown) are attached to a planar carrier 4, which provides a chip-on-board (COB) module. The LED module 1 extends in a longitudinal direction L, which extends perpendicular to the plane of the drawing in FIG. 1, and in a transverse direction W, which extends from top to bottom in the drawing in FIG. 1. A geometrical main emission direction H of the multiple LEDs 3 extends perpendicular to the longitudinal direction L and the transverse direction W.

The multiple LEDs 3 arranged in the array extend in rows R in the longitudinal direction, in which they have a first repeat distance a. In the transverse direction, the rows R are parallel to each other and have a repeat distance b. In the present case, approximately ten rows R of LEDs are arranged next to each other, not all of which are shown in the drawings.

The inverse of the repeat distances a, b defines packing densities of the multiple LEDs 3 in the respective directions. Presently, the distance a is 2 mm to 5 mm, depending on the detailed design. The multiple LEDs 3 have an emitting surface area on the order of approximately 1 mm$^2$. The distance b typically is between 5 mm and 10 mm, and thus, approximately twice the distance a. Accordingly, the packing density in the transverse direction W is only half of that in the longitudinal direction L.

Multiple LED modules 1 can be arranged sequentially, one after the other, in particular in the longitudinal direction, but also in the transverse direction if needed, depending on the requirements of the lamp design. Expediently, each of the sequential modules are appropriately configured with multiple LEDs 3 and/or arranged in sequence such that the distances of the LEDs 3 are equal and/or such that there is as little change as possible in the distribution of the emitted light in the region of the module limits.

A primary optical system 5 is arranged on the LED modules 1, which are provided in the form of a full-surface coating of the LED modules 1 in the present case. The primary optical system 5 comprises lenses 6, in the form of planar-convex collecting lenses in the present case, each right on individual LEDs of the multiple LEDs 3, which bundle a large opening angle of the emitted light. This is associated with predominant bundling of the beams into a structure in the form of a straight line on a target surface (not shown) that extends in the longitudinal direction. The irradiation intensity on the line afforded by the lamp clearly exceeds 2 W/cm$^2$.

For purposes of clarification, two extreme-edge optical paths 7 are drawn in FIG. 1, which converge and meet further up on the line and/or target surface that is not shown here.

The LED modules 1 can be arranged on cooling elements (not shown). The cooling elements preferably have connectors for inlet and outlet of a liquid coolant that flows through the cooling elements in order to dissipate the heat. The coolant can be present in a closed cycle and release the heat in another place by means of a heat exchanger. The heat power to be dissipated in the case of the present lamp is on the order of significantly more than 1 kW.

In addition to the primary optical system 5, a secondary optical system 8 is provided upstream of the LED modules 1 which further improves the bundling of an exit angle of the multiple LEDs 3 that is as large as possible into the structure on the target surface. The secondary optical system 8 is situated at a distance upstream of the LED module 1, but is arranged between the LED module 1 and the target surface 10. The distance between the secondary optical system 8 and the module surface 2 is significantly smaller than the distance of the secondary optical system 8 from the target surface 10 in order to impact the optical path by bundling as early as possible.

The secondary optical system 8 comprises multiple parallel cylinder lenses 9, each of which extend in the longitudinal direction L and is arranged to be parallel to each other in the transverse direction W in the same plane. Accordingly, at least the light from one row of the multiple LEDs 3 is captured through one of the cylinder lenses 12 and bundled into the line and/or structure of the target surface 10 (printed matter). Different beams of light of two LEDs 3 are drawn at different emission angles each in FIG. 1 in an exemplary manner and are all bundled into the same line-shaped structure on the target surface. In this context, the line has a width Q in the transverse direction that is significantly smaller than the distance of the outer rows R of the multiple LEDs 3 in the transverse direction.

In a simplified embodiment of the invention that is not shown here, it is feasible to forego the secondary optical system, wherein the cylinder lenses are provided directly in the primary optical system and extend over the individual rows R of the multiple LEDs 3.

As is evident from symmetry lines drawn in FIG. 1, there is an offset V1 in the transverse direction in the present case between a center 3a of the row of the multiple LEDs 3 and a center 6a of the lenses 6 of the primary optical system 5.

Moreover, the centers 6a of the lenses 6, just like a central plane and/or center 3a of the row of the multiple LEDs 3, have a lateral distance and/or offset V1+V2 in the transverse direction with respect to a central optical plane 9a of a cylinder lens 9 bundling the light of the row R. In this context, V2 is the offset of the center 6a of the lenses 6 of the primary optical system 5 with respect to the central optical plane 9a of the cylinder lens. The offset V1+V2 is increasingly larger, the farther the respective row R is offset in the transverse direction with respect to a central plane Z that coincides with the line of the target surface. Accordingly, there is no offset for a row R that is arranged symmetrically on the central plane Z (see central row R in FIG. 1).

This is made clear from a comparison of the optical paths of the left outer row R and the central row R of the multiple LEDs 3 that is arranged in the central plane Z drawn in FIG. 1. The beams of the peripheral LEDs must be bundled at an angle to the main emission direction (perpendicular line onto the module surface) in order to hit the line on the target surface. The lateral offset V1, V2 in each case optimizes the bundling of an opening angle of the outer LEDs of the multiple LEDs 3, such that it is as large as possible, into the optical path.

Figure 4:
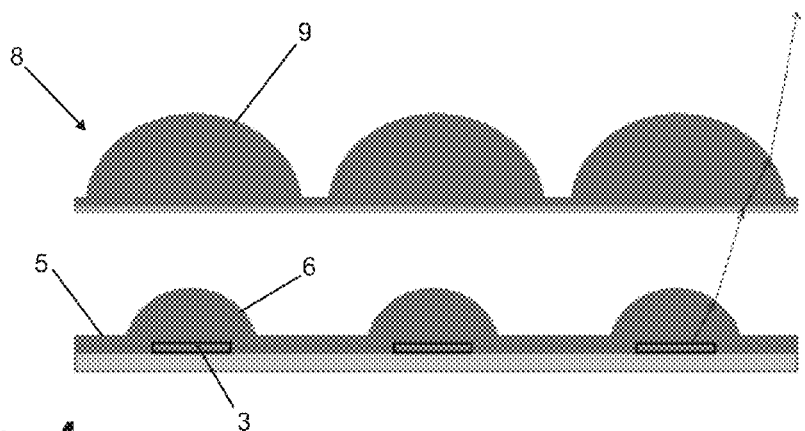
FIG. 4 is a schematic representation of a variant of the lamp of FIG. 1.

In the variant shown in FIG. 4, the multiple LEDs 3 and cylinder lenses 6, 9 are not situated at an offset such that the rows R are bundled into lines on the target surface that are situated next to each other. Depending on the sharpness of bundling, the lines may overlap sufficiently such that overall a relatively broad line is generated that can be quite homogeneous in the transverse direction as well.

Figure 5:
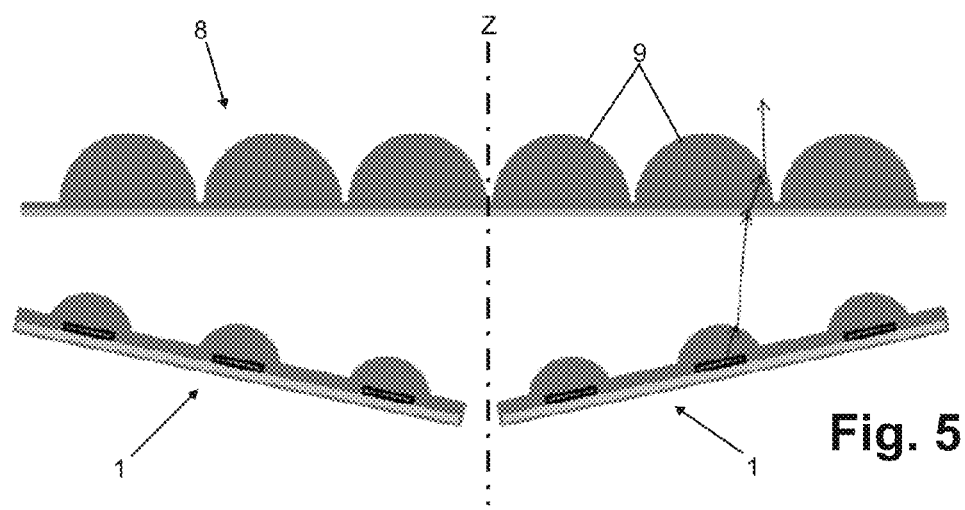
FIG. 5 is a schematic representation of a lamp according to a second embodiment of the invention.

In the exemplary embodiment of the invention shown in FIG. 5, the secondary optical system 8 is provided like in the first exemplary embodiment, wherein all cylinder lenses 9 are situated in a plane that is parallel to the target surface. Two LED modules 1 having primary optical systems 5 are arranged next to each other upstream of the secondary optical system 8 in the transverse direction and are each inclined by the same angle in opposite directions with respect to the secondary optical system 8. Here, a central plane Z extends symmetrically between two cylinder lenses 9, or, as the case may be, between one left inner LED of the multiple LEDs 3 of the left module and one right inner LED of the multiple LEDs 3 of the right module each. Tilting the LED modules 1 like in the first example results in bundling of all rows R of LEDs into the same line on the target surface.

Figure 6:
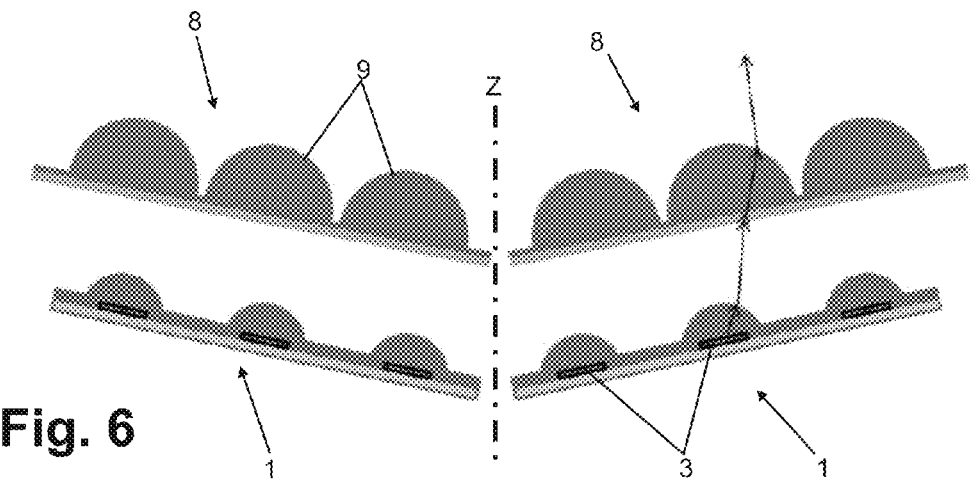
FIG. 6 is a schematic representation of a lamp according to a third embodiment of the invention.

Unlike the example illustrated in FIG. 5, the example illustrated FIG. 6 provides a first secondary optical system 8 to the left of the central plane Z and a second secondary optical system 8 to the right of the central plane Z. The secondary optical systems 8 in this case are arranged to be inclined in opposite directions, like the primary optical systems 5, to favor bundling of the light of the LED rows R into the same line while keeping the opening angle as large as possible. In the present case, the primary optical systems 5 and secondary optical systems 8 that are allocated to each other each again extend parallel to each other, in which an inclined arrangement can be provided just as well depending on the details of optimization and the existing requirements.

Figure 7:
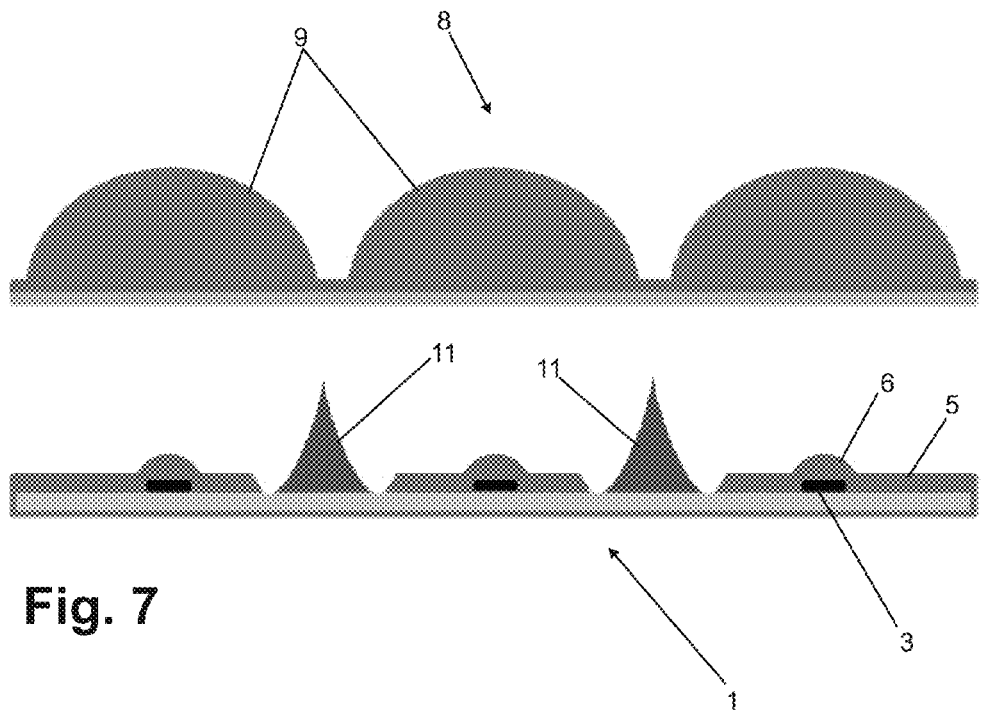
FIG. 7 is a schematic representation of a lamp according to a fourth embodiment of the invention.

In the exemplary embodiment according to FIG. 7, unlike the first exemplary embodiment, additional reflectors 11 are arranged immediately lateral to the multiple LEDs 3. This guides even light emitted at very large angles into the useful optical path. In the present case, the reflectors 11 extend as prismatic bodies over the longitudinal direction of the LED module 1, wherein the reflecting side walls are shaped to be concave.

The primary optical systems in the present case are manufactured according to a method whose principles are described in International Publication No. WO 2012/031703 A1 through coating the COB modules with silicone in an open casting mold. The present secondary optical systems 8 are manufactured according to an analogous procedure, in which a transparent planar substrate 10, rather than the COB modules, is coated with UV-resistant silicone in order to generate the optically active structures 9 (cylinder lenses).

A lamp according to the exemplary embodiments described above is used for purposes of UV drying of lacquer and/or paint in a printing machine, in an offset sheet printing press in the present case. An extension of the lamp in the longitudinal direction typically is more than 1 meter, specifically 1.6 meters in the present case, which corresponds to the sheet width of the printed matter. In order to implement lengths of this order, multiple modules 1 and secondary optical systems 8 are typically arranged one after the other in the longitudinal direction.

The lamp components described above are accommodated in a housing (not shown) that is optimized with respect to the installation space.

An irradiation intensity on the target surface with respect to the longitudinal direction is approximately 10 Watts per cm in the present case. In this context, most of the light is in a wavelength range below 470 nm.

In order to manufacture LED lamps with very high optical output power, LEDs of a size of 0.1-200 $mm^2$, typically 1-2 $mm^2$ are assembled through the chip-on-board (COB) procedure. In this context, multiple LEDs, typically 4-200 chips, are assembled into a module on a common sub-state having a surface area on the order of 5 to 50 $cm^2$. The desired lamp length is then generated by placing modules configured with LEDs in series.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

The invention claimed is:

1. A lamp comprising:
at least one module (1) having a plurality of light emitting diodes (LEDs) (3) distributed over a module surface (2), wherein the plurality of LEDs (3) are arranged in a plurality of rows (R) in a longitudinal direction (L) of the at least one module (1), and wherein more than one of the plurality of rows (R) are arranged next to each other in a transverse direction (W) of the at least one module (1) that is perpendicular to the longitudinal direction (L), and
an optical system (5, 8) for bundling light emitted by the plurality of LEDs (3), the optical system (5,8) comprising a primary optical system (5) and a secondary optical system (8) for bundling the emitted light into a line on a target surface,
wherein the primary optical system (5) comprises a plurality of lenses (6) that are arranged directly on the plurality of LEDs (3), the primary optical system being provided as a transparent polymer layer that is applied to the at least one module (1) and extends, as a single part, above at least two of the plurality of LEDs (3), and
wherein the secondary optical system (8) is arranged in an optical path of the emitted light while being spatially separated from the at least one module (1), the secondary optical system (8) including a plurality of first cylinder lenses (9), each of which extends in the longitudinal direction (L) and is assigned to one the rows (R) of LEDs (3), each first cylinder lens (9) being configured to bundle light from the LEDs (3) in the corresponding row (R) into the line on the target surface.

2. The lamp according to claim 1, wherein the primary optical system (5) comprises reflectors (11) that are arranged immediately lateral to the plurality of LEDs (3).

3. The lamp according to claim 1, wherein the plurality of lenses (6) that are arranged above the plurality of LEDs (3) are positioned at a lateral offset (V1) in the transverse direction with respect to a center (3a) of the plurality of LEDs (3).

4. The lamp according to claim 1, wherein the secondary optical system (8) is provided as a transparent polymer layer on a transparent substrate (10).

5. The lamp according to claim 1, wherein at least two of the first cylinder lenses are arranged next to each other in a plane.

6. The lamp according to claim 5, wherein the plane is inclined with respect to the module surface (2) or target surface.

7. The lamp according to claim 1, wherein a central plane (3a) of the first row of the plurality of rows (R) of the plurality of LEDs (3), and a central optical axis (9a) situated parallel to the central axis of the row of the plurality of LEDs (3) of one of the first cylinder lenses (9) bundling the light of the row, are offset (V2+V1) with respect to each other in the transverse direction.

8. The lamp according to claim 1, wherein a packing density of the plurality of LEDs (3) in the longitudinal direction (L) is larger than in the transverse direction (W).

9. The lamp according to claim 1, wherein the lamp is configured to dry a coating.

* * * * *